United States Patent [19]

Eberl et al.

[11] Patent Number: 5,986,287
[45] Date of Patent: Nov. 16, 1999

[54] SEMICONDUCTOR STRUCTURE FOR A TRANSISTOR

[75] Inventors: Karl Eberl, Weil der Stadt; Karl Brunner, Stuttgart, both of Germany

[73] Assignee: Max-Planck-Gesellschaft zur Foerderung der Wissenschaften e. V., Munich, Germany

[21] Appl. No.: 08/708,343

[22] Filed: Sep. 6, 1996

[30] Foreign Application Priority Data

Sep. 8, 1995 [DE] Germany .......................... 195 33 313

[51] Int. Cl.⁶ ................. H01L 31/0312; H01L 31/0328; H01L 31/0336; H01L 31/072
[52] U.S. Cl. ............................. 257/77; 257/198; 257/590
[58] Field of Search .................... 257/197, 198, 257/77, 590

[56] References Cited

U.S. PATENT DOCUMENTS 5,536,952   7/1996   Shikata ....................................... 257/77

OTHER PUBLICATIONS

Sturm, J.C., et al., "Well–Resolved Band–Edge Photoluminesence of Excitons Confined in Strained $Si_{1-x}Ge_x$ Quantum Wells", *Physical review Letters*, 66(10):1362–1365 (1991).

Ismail, K., et al., Identification of a Mobility–Limiting Scattering Mechanism in Modulation–Doped Si/SiGe Heterostructures, *Physical Review Letters*, 73(25):3447–3450 (1994).

Fitzgerald, E.A., et al., "Epitaxially Stabilized $Ge_xSn_{1-x}$ Diamond Cubic Alloys", *Journal of Electronic Materials* 20(6):489–501 (1991).

Wegscheider, W., et al., "Single–crystal Sn/Ge superlattices on Ge substrates: Growth and structural properties", *Appl. Phys. Lett.*, 57(9):875–877 (1990).

Iyer, S.S., et al., "Synthesis of $Si_{1-y}C_y$ alloys by molecular beam epitaxy", *Appl. Phys. Lett* 60(3):356–658 (1992).

Eberl, K., et al., "Growth and strain compensation effects in the ternary $Si_{1-x-y}Ge_xC_y$ alloy system", *Appl. Phys. Lett*, 60(24):3033–3035 (1992).

Boucard, P., et al., "Band–edge and deep level photoluminsecence of pseudomorphic $Si_{1-x-y}Ge_xC_y$ alloys", *Appl. Phys. Lett.* 64(7):875–877 (1994).

Eberl, K., et al., "The growth and characterization of $Si_{1-y}C_y$ alloys on Si(001) substrate", *J. Vac. Sci. Technol. B* 10(2):934–936 (1992).

Rücker, H., et al., "Strain–Stabilized Highly Concentrated Pseudomorphic $Si_{1-x}C_x$ Layers in Si", *Physical Review Letters*, 72(22):3578–3581 (1994).

Soref, Richard A., "Optical band gap of the ternary semiconductor $Si_{1-x-y}Ge_xC_y$", *J. Appl. Phys.* 70(4):2470–2472 (1991).

Powell, A.R., et al., "$Si_{1-x-y}Ge_xC_y$ growth and properties of the ternary system", *Journal of Crystal Growth* 127:425–429 (1993).

Demkov, Alexander A., et al. "Theoretical investigation of random Si–C alloys", *Physical Review B* 48(4):2207–2214 (1993).

Dean, P.J., et al., "New Radiative Recombination Processes Involving Neutral Donors and Acceptors in Silicon and Germanium", *Physical Review* 161(3):711–729 (1967).

(List continued on next page.)

*Primary Examiner*—Brian Dutton
*Attorney, Agent, or Firm*—Townsend and Townsend and Crew LLP

[57] ABSTRACT

Semiconductor structure for a transistor, having at least one doped crystalline semiconductor layer (3) consisting of a semiconductor material such as silicon or germanium which is applied onto a further crystalline layer, wherein the doped semiconductor layer (3) contains carbon alloyed with this semiconductor material to improve the conduction characteristics, and wherein a desired strain can be set in the active semiconductor layer (3) via the proportion of carbon relation to the semiconductor material.

3 Claims, 4 Drawing Sheets

OTHER PUBLICATIONS

Menendez, J., et al. "Raman spectroscopy study of microscopic strain in epitaxial $Si_{1-x-y}Ge_xC_y$ alloys", *Appl. Phys. Lett.* 66(10):1160–1162 (1995).

Boucaud, P., et al., "Photoluminescence of strained $Si_{1-x}C_y$ alloys grown at low temperature", *Appl. Phys. Lett* 66(1):70–72 (1995).

Wachter, M., et al., "Photoluminescence of confined excitons in MBE-grown $Si_{1-x}Ge_x/Si(100)$ single quantum wells", *Thin Solid Films* 222:10–14 (1992).

Weber, J., et al., "Near-band-gap photoluminescence of Si-Ge alloys", *Physical Review B* 40(8):5683–5693 (1989).

a)

b)

a)

b)

a)

b)

SEMICONDUCTOR STRUCTURE FOR A TRANSISTOR

BACKGROUND OF THE INVENTION

The present invention relates to a semiconductor structure for a transistor, having at least one doped crystalline semiconductor layer of a semiconductor material such as silicon or germanium, which is applied onto a further crystalline layer.

DESCRIPTION OF PRIOR ART

Such semiconductor structures are, for example, used in field effect transistors in which a semiconductor layer of p-type conductivity or n-type conductivity is applied onto a silicon substrate.

When using silicon as a semiconductor material in the active layer of field effect transistors a good electron mobility is admittedly present, the hole mobility is, however, in contrast, substantially lower. With the complementary MOS field effect transistor circuits (CMOS) principally used for semiconductor components the p-channel field effect transistor must accordingly be made substantially larger than the n-channel field effect transistor. This has the consequence that the complementary components do not ideally fit together in integrated circuits.

Since germanium has a good hole mobility, an attempt has been made to use silicon-germanium alloy layers as semiconductor material for p-channel field effect transistors. For this purpose, silicon-germanium layers have been pseudomorphously applied onto a silicon substrate. As a result of the greatly differing lattice constants of silicon and germanium, only a low germanium content of approximately 30% can be used in the alloy layer because the critical thickness of a silicon-germanium alloy layer with a higher germanium concentration, or indeed of a pure germanium layer, is so small that a practical use of such a structure would not be possible. The achievable increase in the hole mobility, when compared with silicon, is thus relatively small.

In n-channel field effect transistors an attempt has also already been made to increase the electron mobility, and indeed by the use of relaxed silicon-germanium buffer layers between the silicon substrate and the silicon layer of n-type conductivity. The silicon layer of n-type conductivity is thereby laterally expanded, which leads to an increase of the electron mobility. The relaxed silicon-germanium buffer layers are, however, several microns thick and have an unfavourable surface structure so that a use for integrated circuits is difficult.

Heterobipolar transistors also have the initially named semiconductor structure and it has been shown that silicon-germanium hetero structures are favourable for bipolar transistors of the npn type. It is, however, disadvantageous that there are no complementary bipolar transistors of pnp type which are of comparable quality. Neither silicon nor silicon-germanium are suitable for bipolar transistors of the pnp type.

SUMMARY OF THE INVENTION

The invention is thus based on the object of setting forth a semiconductor structure for a transistor with which the named problems can be overcome. In particular a p-channel field effect transistor with high hole mobility, an n-channel field effect transistor with increased electron mobility and a bipolar transistor of the pnp type with characteristics comparable with the existing npn types are to be provided.

BRIEF DESCRIPTION OF THE INVENTION

This object is satisfied in accordance with the invention in that the doped semiconductor layer contains carbon, with the carbon being alloyed with the semiconductor material, and wherein a desired strain of the active semiconductor layer is set via the proportion of carbon in relation to the semiconductor material.

The carbon present in an alloy in accordance with the scheme $HL_{1-x}C_x$ in the semiconductor layer (where HL represents the semiconductor material) can either be substitutionally incorporated into the crystal lattice of the semiconductor material, or can be present as a multi-layer structure with alternating individual layers of carbon and semiconductor material, which are in particular only a few atomic layers thick.

It is decisive that, due to the carbon in the active semiconductor layer, the lattice constant of this semiconductor layer is so changed that it is laterally extended or compressed as a result of its connection to the further crystal layer, so that a desired strain results in the active semiconductor layer.

An application of the semiconductor structure of the invention relates to a field effect transistor in which germanium serves as the semiconductor material and the semiconducting layer is of p-type conductivity, with the semiconductor layer in particular being applied pseudomorphously onto a crystalline silicon layer. Through the carbon in the germanium semiconductor layer the lattice constant is reduced relative to a pure germanium layer. The lattice constant of the germanium-carbon layer approximates to that of the lattice constant of the silicon layer, onto which it is applied. This silicon layer can be a silicon substrate or a silicon buffer layer, which is, in turn, arranged on a substrate. Since the lattice constants approach one another, the strain in the active semiconductor layer is reduced, whereby it is also possible to achieve a greater layer thickness. That is to say, the critical layer thickness is increased relative to a pure germanium layer through the reduced strain.

The quantity of carbon in the germanium layer is preferably only made sufficiently large that the critical layer thickness achieves a value which enables the realisation of a p-channel field effect transistor. The carbon concentration and the silicon concentration in the germanium semiconductor layer should therefore in each case only be as large as is required for adequate stability of the component and/or for an adequate critical layer thickness in order to obtain the best possible hole mobility in the plane of the layer.

The strain in the germanium semiconductor layer is, however, preferably not fully compensated, but rather a specific strain is set. Through the remaining strain the hole mobility is larger in the plane of the germanium layer than perpendicular to it or, expressed differently, the effective mass of the holes is smaller for a movement in the plane of the germanium layer than for a movement perpendicular to it. In this way the holes are concentrated in the vicinity of the gate so that a larger density of quantum states of the holes is possible in the Germanium layer.

Another possibility exists in using an alloy of silicon and germanium as the semiconductor material for the p-channel field effect transistor in place of germanium. In this case the proportion of germanium in the alloy can be selected to be sufficiently large that a significant increase of the hole mobility and/or a reduction of the effective mass of the holes, results, with the critical thickness of the semiconductor layer being at the same time sufficiently large for a practical application as a result of the reduced strain. Here the strain is preferably not fully compensated in order to bring about a differential hole mobility in the plane of the layer and perpendicular hereto.

A further application of the semiconductor structure of the invention relates to an n-channel field effect transistor. In accordance with the invention silicon is used as the semiconducting material for the semiconductor layer of n-type conductivity, and this active semiconductor layer is in particular pseudomorphously applied onto a crystalline silicon layer. The proportion of carbon in the active semiconductor layer preferably amounts to between ca. 0.2% and ca. 10%, in accordance with the alloy formula $Si_{0.9}Co_{0.1}$ to $Si_{0.98}C_{0.02}$.

Through the carbon which is present either in a substitutionally incorporated form or in individual layers of a multi-layer structure, the lattice constant of the active semiconductor layer of n-type conductivity is reduced relative to pure silicon. With the arrangement on a crystalline silicon layer the active semiconductor layer is thus laterally extended. The resulting strain in the active semiconductor layer has the consequence of a reduction of the effective electron mass and thus an increase in the electron mobility in the layer plane. The electron mobility perpendicular to the layer plane is, however, lower than in the layer plane so that the electrons are concentrated in the vicinity of the gate and a higher density of quantum states of the electrons is made possible in the active layer.

A further advantage lies in the fact that the active silicon layer can be directly applied onto a silicon substrate. Relatively complicated relaxed silicon-germanium buffer layers, which are expensive to produce, such as have been used up to now, are thus avoided. In all the cases indicated a metal oxide semiconductor (MOS) or a modulation doped (MOD) field effect transistor can be used by way of example as the field effect transistor.

As a result of the relatively simple layout of the previously described p- and n-channel field effect transistors, the latter can be advantageously combined into a CMOS circuit, with either only one field effect transistor structure or, however, both field effect transistor structures being designed in accordance with the invention in the CMOS circuit. In the second case a silicon layer containing carbon can be applied onto the silicon substrate and can, in turn, serve as a laterally extended semiconducting layer of n-type conductivity for the n-channel field effect transistor. On the other hand, a germanium semiconductor layer containing carbon or a silicon-germanium semiconductor layer containing carbon can be applied onto the carbon-containing silicon layer and serve as a semiconductor layer of p-conductivity for the p-channel field effect transistor.

In addition, an intermediate layer of silicon can be provided between the laterally extended silicon layer and the germanium carbon or silicon-germanium carbon layer. In the same way a silicon buffer layer can be provided on the silicon substrate. The field effect transistors can, in turn, be formed as metal oxide semiconductors or as modulation doped field effect transistors. In all variants a thin silicon cover layer can in each case be provided in order to achieve a good boundary surface to the insulating layer of silicon dioxide.

A further application of the semiconductor structure of the invention relates to a bipolar transistor of the pnp-type, in which silicon serves as the semiconductor material and the base layer contains carbon. The transistor thus has a heterostructure.

The base layer of n-type conductivity again receives, through the carbon, a lattice constant which is reduced relative to pure silicon so that the base layer is laterally extended by the connection to the emitter layer and the collector layer and a strain results in the base layer. Through this strain the effective mass of the electrons is, in turn, reduced and the mobility increased. This leads to a reduction of the lateral resistance in the base.

A further advantage of the heterobipolar transistor of the invention lies in the fact that a band edge step arises in the conduction band. The band edge step in the conduction band results, due to the smaller band gap in the silicon-carbon layer of the base relative to the silicon layers. This leads advantageously to a reduction of the electron injection into the emitter.

The carbon concentration in the base layer can be constant or can have a gradient in the direction of the pnp-transition. Through a gradient of this kind in the carbon concentration a drift field can be generated in the base which accelerates the holes.

A further advantage of the hetero bipolar transistor of the invention lies in the fact that the semiconductor layers consist essentially of silicon and thus the classical silicon technology which is well controlled can be used. Through the silicon boundary surfaces it is possible to use silicon dioxide as the insulator. In addition, the silicon carbon layer has a selective etching behaviour which facilitates the manufacture of the component.

Through the semiconductor structure of the invention a pnp heterobipolar transistor is thus provided which is complementary to the known npn heterobipolar transistors with a silicon-germanium base layer and has good characteristics comparable thereto.

BRIEF DESCRIPTION OF THE DRAWINGS

Examples of the invention are shown in the drawings and will be described in the following. There are shown, in each case in a schematic representation.

DESCRIPTION OF PREFERRED EMBODIMENTS

Figure 1:
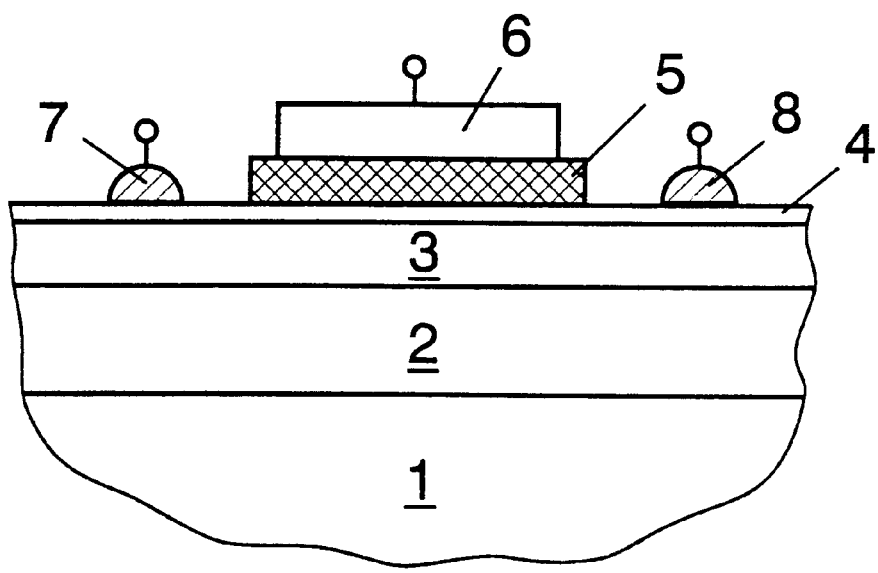
FIG. 1a a p-channel MOSFET.
FIG. 1b the band diagram of this MOSFET.
Figure 1:
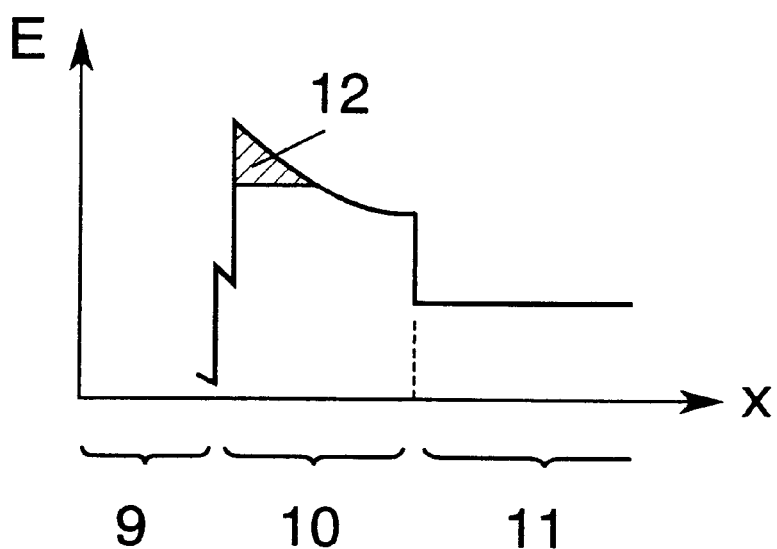

The p-channel MOSFET illustrated in FIG. 1 has a single silicon crystal substrate 1 onto which a silicon buffer layer 2 is epitaxially applied. A semiconductor layer 3 of p-type conductivity is likewise epitaxially applied onto the silicon buffer layer 2. This active semiconductor layer 3, forming the p-channel of the MOSFET, consists of germanium or silicon and germanium with a proportion of carbon, with both the proportion of silicon and of carbon being kept as low as possible in order to ensure the best possible hole conduction.

The carbon can be substitutionally incorporated in the semiconductor layer 3 into the crystal lattice of the germanium or of the silicon-germanium alloy. Another possibility is to form the semiconductor layer 3 as a multi-layer structure with alternating individual layers of germanium or silicon-germanium and carbon, with the individual layers consisting of only a few atomic layers. The germanium or silicon-germanium individual layers can, for example, be five atomic layers thick, whereas the individual carbon layer can, for example, be only one atomic layer thick.

As a termination a thin silicon layer 4 can be provided on the semiconductor layer 3 serving as the p-channel in order to provide a good boundary surface for an insulating layer of silicon dioxide. This is, however, not absolutely essential. An insulating layer 5 of silicon dioxide is arranged on the semiconductor layer 3 or, as shown in FIG. 1, on the thin silicon layer 4, and a metal electrode 6 serving as a gate is arranged on the latter. Finally, a source electrode 7 and a drain electrode 8 are present on both sides of the insulating layer 5 and of the metal electrode 6.

The semiconductor layer 3 of germanium-carbon or silicon-germanium-carbon forms the p-channel of the MOSFET. Through the carbon the lattice constant of the semiconductor layer 3 is approximated to the lattice constant of the silicon and thereby the strain in the semiconductor layer 3 is reduced to a desired value, which, one the one hand, ensures an adequately large critical layer thickness and, on the other hand, a further increased density of states of the holes at the upper side of the transport layer. Since the hole mobility perpendicular to the plane of the layer is reduced, the holes are thus concentrated in the vicinity of the source and drain electrodes.

The shape of the valence band of the p-channel MOSFET of the invention is shown in FIG. 1b, with the layer sequence being drawn in on the abscissa and the energy on the ordinate. Section 9 relates to the insulating layer 5, section 10 to the semiconductor layer 3 forming the p-channel and section 11 to the silicon buffer layer 2 and silicon substrate 1. One recognises the band edge step between the regions 10 and 11 and also the p-channel 12.

Figure 2:
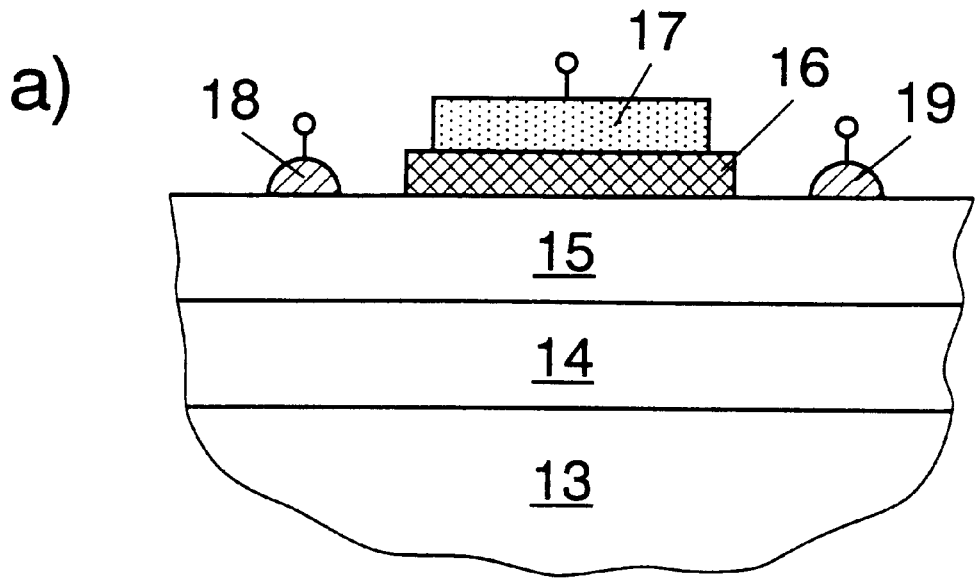
FIG. 2a an n-channel MOSFET.
FIG. 2b the band diagram of this MOSFET.
Figure 2:
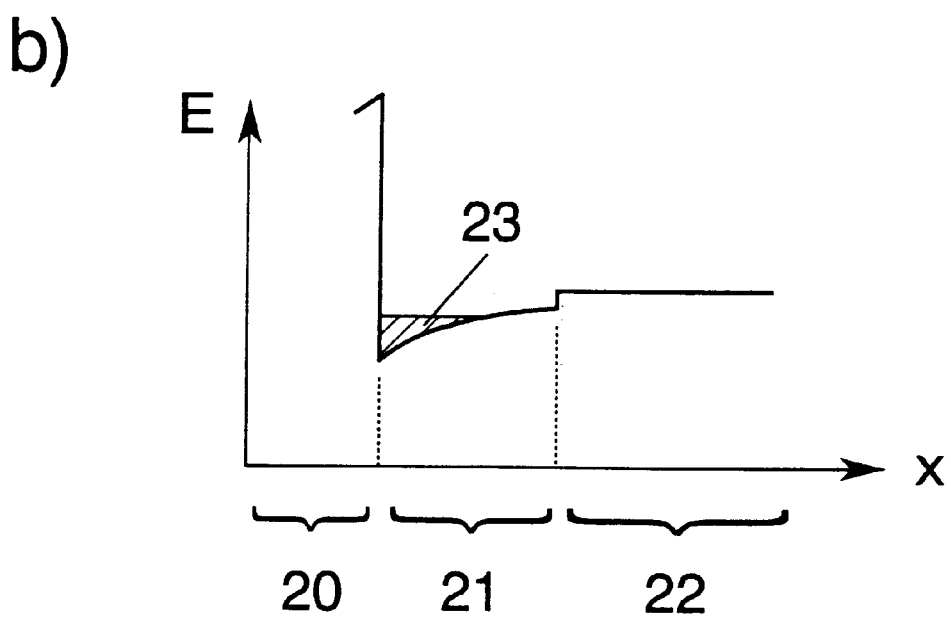

FIG. 2 shows an n-channel MOSFET which, from the point of view of its layout, largely corresponds to the p-channel MOSFET illustrated in FIG. 1. A silicon buffer layer 14 follows on a silicon substrate 13 and an active semiconductor layer 15 follows the silicon buffer layer 14. However, the layer 15 is here of n-type conductivity and has silicon as a semiconductor material in addition to the carbon. An insulating layer 16 of silicon dioxide is again present on the semiconductor layer 15 and a metal electrode 17 acting as a gate is present on the insulating layer 16 of silicon dioxide. Finally, a source electrode 18 and a drain electrode 19 are arranged on the two sides of the insulating layer 16 and of the metal electrode 17.

The carbon containing active semiconductor layer 15 forms the n-channel of the MOSFET, with the carbon leading to a reduced lattice constant of the semiconductor layer 15 relative to a pure silicon layer, so that the semiconductor layer 15 arranged on the silicon buffer layer is laterally extended. As a result of the lateral extension a strain results in the silicon-carbon layer 15, which leads to an increased electron mobility between the source and drain electrodes 18 and 19 respectively. Through the strain the electron mobility is at the same time reduced perpendicular to the active semiconductor layer 15 so that a further increased density of states of the conduction electrons is made possible at the surface of this layer.

The shape of the conduction band of the n-channel MOSFET of the invention is shown in FIG. 2, and again the layer sequence is recorded on the abscissa and the energy on the ordinate. Section 20 relates to the insulating layer 16, section 21 to the active semiconductor layer 15 and section 22 to the silicon buffer layer 14 and the silicon substrate 13.

One recognises the band edge step between the sections 21 and 22 in the conduction band and also the n-channel 23.

Figure 3:
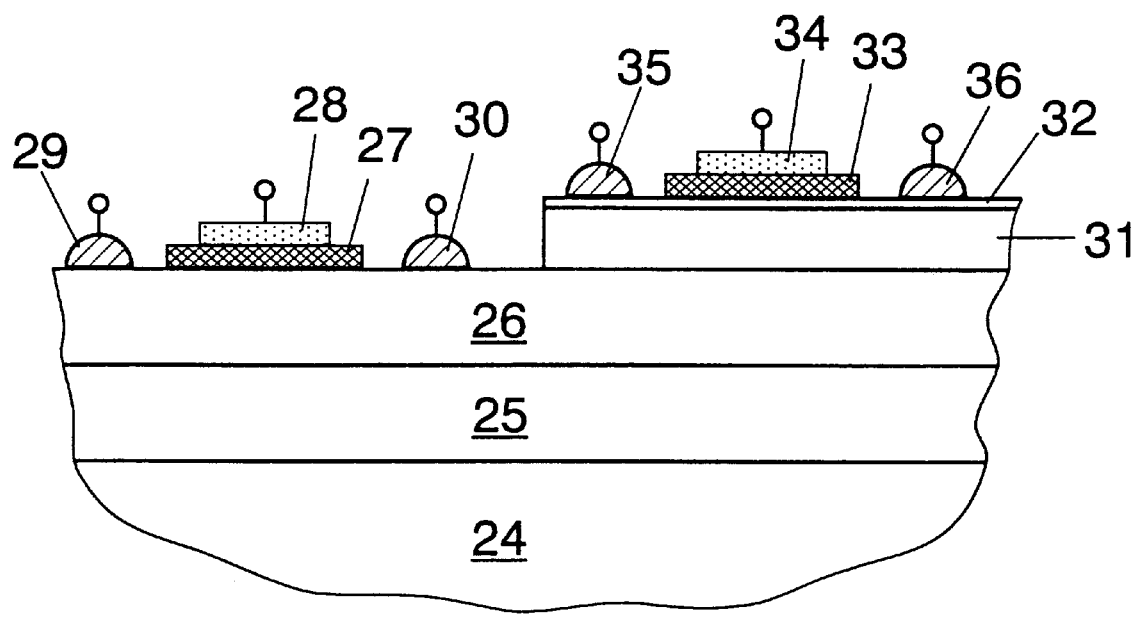
FIG. 3 a CMOS circuit.

FIG. 3 shows a CMOS circuit, the p- and n-channel MOSFETs of which are built up in accordance with the FIGS. 1 and 2. A silicon buffer layer 25 is arranged on a silicon substrate 24 and a further silicon layer 26 of n-type conductivity and which preferably contains carbon, is arranged on the silicon buffer layer 25.

In the left hand half of FIG. 3 an insulating layer 27 of silicon dioxide is arranged on the active silicon layer 26 and a metal electrode 28 is arranged on the insulating layer 27 and serves as a gate. A source electrode 29 and a drain electrode 30 are respectively arranged on the two sides of the insulating layer 27 and of the gate 28. A semiconductor layer 31 of p-type conductivity of germanium or silicon-germanium and carbon is arranged on the right hand half of the active silicon layer 26 in FIG. 3. A thin silicon layer 32 is arranged on this active semiconductor layer 31 and an insulating layer 33 of silicon dioxide is arranged on the thin silicon layer 32 and a metal electrode 34 acting as a gate is arranged on the insulating layer 33. A source electrode 35 and a drain electrode 36 are respectively located on the two sides of the insulating layer 33 and of the gate electrode 34.

The left hand half of the illustrated transistor structure thus forms an n-channel MOSFET, and the right hand half of the structure forms a p-channel MOSFET, which are preferably both built up in the manner of the invention. Both the silicon-carbon layer 26 and also the germanium-carbon layer 31 or the silicon-germanium-carbon layer 31 have a desired strain which leads to a high electron or hole mobility between the source and drain electrodes 29, 30 and 35, 36 respectively. At the same time the electron or hole mobility perpendicular to the active semiconductor layers 26 and 31 is reduced, so that a further enhanced density of states of the holes or electrons is possible.

A particular advantage of the CMOS circuit of the invention resides in the fact that the p-channel MOSFET is approximately the same size as the n-channel MOSFET and can be applied with the latter in a convenient manner on a common silicon substrate. Additionally, a silicon intermediate layer can be provided between the silicon-carbon layer 26 and the germanium-carbon layer 31 or the silicon-germanium-carbon layer 31. Both the n-channel and also the p-channel have excellent transport characteristics and are adequately stable for practical use.

Figure 4:
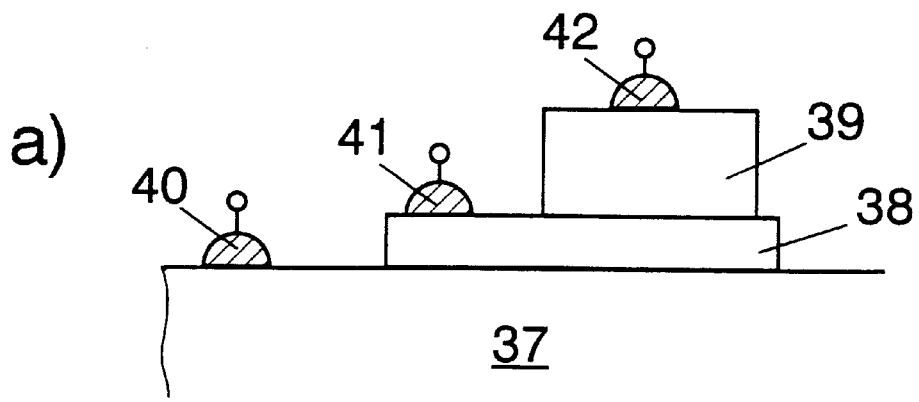
FIG. 4a a pnp bipolar transistor.
FIG. 4b the band diagram of this transistor.
Figure 4:
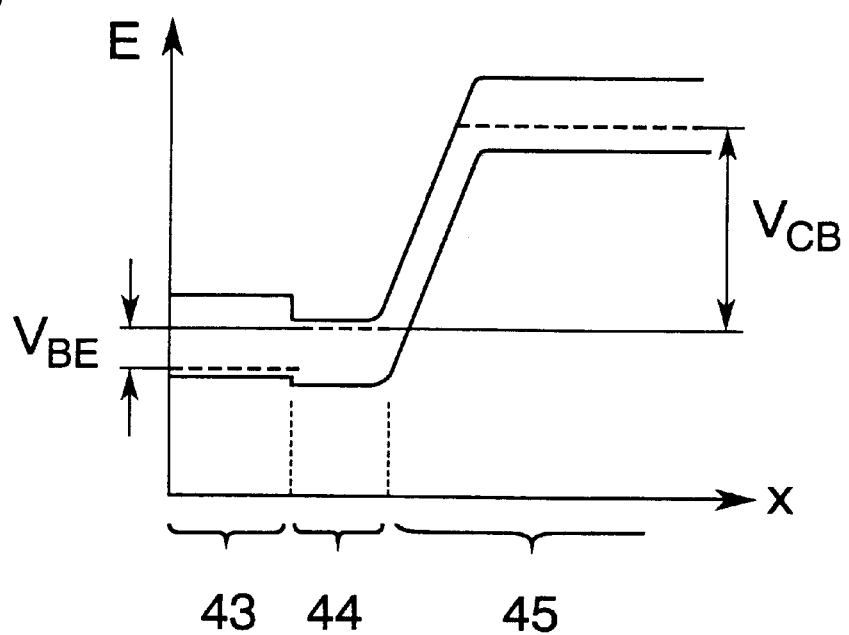

In the hetero bipolar transistor of the invention shown in FIG. 4 an n-conductive silicon-carbon layer 38 is epitaxially deposited on a p-conductive silicon layer 37 and a p-conductive silicon layer 39 is, in turn, epitaxially deposited on the n-conductive silicon-carbon layer 38. The p-conductive silicon layer 37 serves as a collector and is provided with an electrode 40. The silicon carbon layer 38 serves as the base and has an electrode 41. The p-conductive silicon layer 39 arranged thereon serves as the emitter and is provided with an electrode 42.

Due to the carbon in the base layer 38 its lattice constant is reduced relative to that of pure silicon so that, as a result of the connection to the two silicon layers 37 and 39, a lateral extension of the base layer and thus a strain results, which leads to an increase of the electron mobility. In addition, the carbon in the base layer 38 leads to a band edge step in the conduction band. In this way the electron injection into the emitter 39 is advantageously reduced.

The band shape of the bipolar transistor of the invention is shown in FIG. 4b. Here the abscissa also shows the layer sequence, whereas the ordinate gives the energy level.

Section 43 is associated with the emitter layer 39, section 44 is associated with the base layer 38 and section 45 is associated with the collector layer 37. One recognises the band edge step in the conduction band between section 43 and section 44.

A drift field can additionally be generated by a gradient in the carbon concentration in the base layer 38 in the direction towards the pnp transition, and this drift field additionally accelerates the holes. The illustrated pnp silicon-carbon hetero bipolar transistor structure is complea mentary to the known npn silicon-germanium hetero bipolar transistors. Here the silicon-carbon layer can also be formed both as an alloy and also as a multi-layer structure.

What is claimed is:

1. Bipolar transistor of the pnp-type comprising a semiconductor structure having at least one doped crystalline semiconductor layer of a semiconductor material, such as silicon or germanium, which is applied onto a further crystalline layer, wherein the doped semiconductor layer contains carbon, with the carbon being alloyed with the semiconductor material, a strain of the doped semiconductor layer is set via the proportion of the carbon in relationship to the semiconductor material, the silicon or germanium serves as the semiconductor material, and the doped semiconductor layer of n-type conductivity contains the carbon.

2. Bipolar transistor in accordance with claim 1, wherein the carbon concentration in the doped semiconductor layer is substantially constant in the direction of the pnp transition.

3. Bipolar transistor in accordance with claim 1, wherein the carbon concentration in the doped semiconductor layer has a gradient in the direction of the pnp transition.

* * * * *